United States Patent [19]
Callahan et al.

[11] Patent Number: 5,347,278
[45] Date of Patent: Sep. 13, 1994

[54] PULSE DENSITY MAPPING METHOD AND CIRCUIT FOR DELTA SIGMA MODULATORS

[75] Inventors: Kent R. Callahan, Colorado Springs; Christopher J. Kemp, Monument, both of Colo.

[73] Assignee: Ford Motor Company, Dearborn, Mich.

[21] Appl. No.: 129,886

[22] Filed: Sep. 30, 1993

[51] Int. Cl.$^5$ .............................................. H03M 3/02
[52] U.S. Cl. ........................................................... 341/143
[58] Field of Search ....................... 341/143, 55, 76, 77; 375/27, 28, 30, 31

[56] References Cited

U.S. PATENT DOCUMENTS

| | | |
|---|---|---|
| 3,292,086 | 12/1966 | Magnuski . |
| 3,731,072 | 5/1973 | Johnston . |
| 4,958,158 | 9/1990 | Hashizume et al. . |
| 5,079,551 | 1/1992 | Kimura et al. .................. 341/143 |

OTHER PUBLICATIONS

Oversampled Sigma-Delta Modulation, Robert M. Gray, Reprinted from IEEE Trans. Commun., vol. COM-35, pp. 481–489, May 1987.
A Unity Bit Coding Method by Negative Feedback, Hiroshi Inose, Reprinted from Proc. IEEE, vol. 51, pp. 1524–1535, Nov. 1963.
Oversampling Methods for A/D and D/A Conversion, James C. Candy and Gabor C. Temes, pp. 1–25, 1992.

*Primary Examiner*—Brian K. Young
*Attorney, Agent, or Firm*—Richard D. Dixon; Roger L. May

[57] ABSTRACT

A method for mapping the serial 0 and 1 pulses received at a known clock rate from a Delta Sigma Modulator. All 0's are generated at the output when no 11 pairs are present in the input signal during the sampled clock periods. A 1 is generated at the output responsive to the input signal and the input signal delayed by one clock period both being 1's when no 00 pairs are present in the input signal during the sampled clock periods. A 1 is generated at the output for each 11 pair not balanced by a 00 pair when 11 and 00 pairs are serially alternating in the input signal during the sampled clock periods. According to this mapping method, the pulse density of 1's in the output signal increases only responsive to an increase in the net number of 11 pairs in the input signal during the sampled clock periods. A circuit for implementing this pulse mapping method is also described.

8 Claims, 2 Drawing Sheets

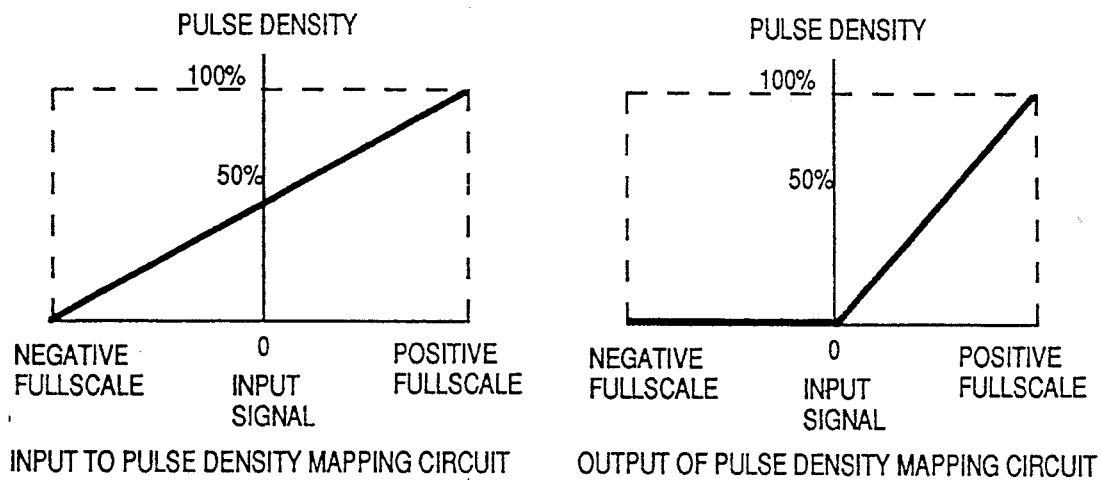
INPUT TO PULSE DENSITY MAPPING CIRCUIT
FIG. 1
OUTPUT OF PULSE DENSITY MAPPING CIRCUIT
FIG. 2
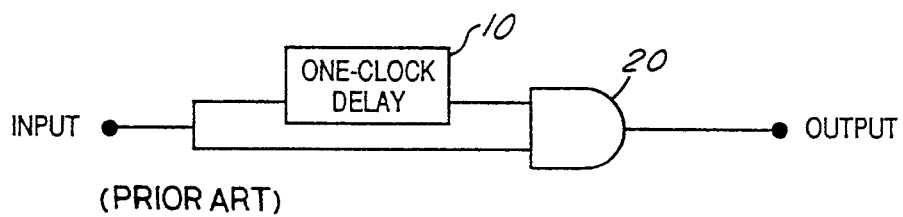
(PRIOR ART)
FIG. 3
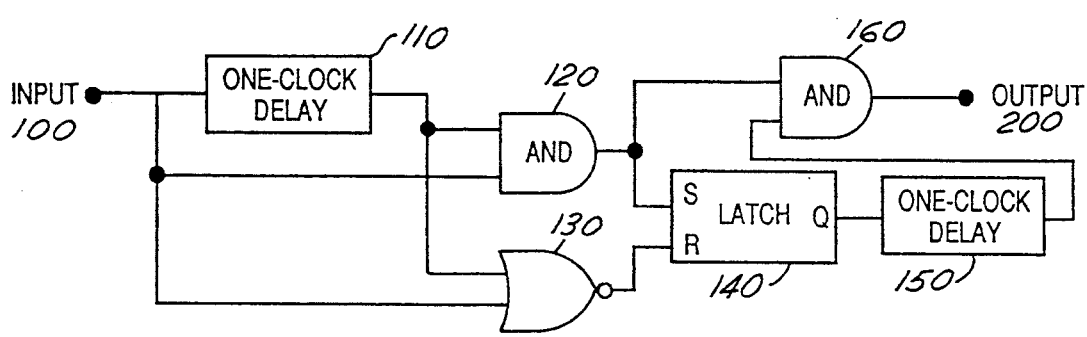
FIG. 4

NEGATIVE FULLSCALE INPUT SIGNAL
INPUT (0% PULSE DENSITY):     0000000000000000000
OUTPUT (0% PULSE DENSITY):    0000000000000000000

NEGATIVE HALFSCALE INPUT SIGNAL
INPUT (25% PULSE DENSITY):    0001000100010001000
OUTPUT (0% PULSE DENSITY):    0000000000000000000

NEGATIVE ONE-FIFTH OF FULLSCALE INPUT SIGNAL
INPUT (40% PULSE DENSITY):    0100101001010010100
OUTPUT (0% PULSE DENSITY):    0000000000000000000

ZERO INPUT SIGNAL
INPUT (50% PULSE DENSITY):    0101010101010101010
OUTPUT (0% PULSE DENSITY):    0000000000000000000

POSITIVE ONE-FIFTH OF FULLSCALE INPUT SIGNAL
INPUT (60% PULSE DENSITY):    0110101101011010110
OUTPUT (20% PULSE DENSITY):   0010000100001000010

POSITIVE HALFSCALE INPUT SIGNAL
INPUT (75% PULSE DENSITY):    0111011101110111011
OUTPUT (50% PULSE DENSITY):   0011001100110011001

POSITIVE FULLSCALE INPUT SIGNAL
INPUT (100% PULSE DENSITY):   1111111111111111111
OUTPUT (100% PULSE DENSITY):  1111111111111111111

FIG.5

INPUT:  010101011001011010011001101001010101010101
OUTPUT: 000000001000001000001000100000000000000000

FIG.6

INPUT:            010101011001011010011001101001010101010101
AND 1 OUTPUT:     000000001000001000001000100000000000000000
LATCH Q:          000000001100001111001100111100000000000000
LATCH Q DELAYED:  000000000110000111100110011110000000000000
OUTPUT:           000000000000000000000000000000000000000000

FIG.7

PULSE DENSITY MAPPING METHOD AND CIRCUIT FOR DELTA SIGMA MODULATORS

BACKGROUND OF INVENTION

1. Field of the Invention

The present invention is related to a pulse density mapping circuit which is utilized in conjunction with a delta-sigma modulator in order to correct for the extraneous 1's introduced in the output signal when the input signals are in the 50% range, and when the digital output is desired to be 0 for all negative going analog input signals.

2. Description of the Prior Art

In many sensor and other applications, it is desirable to convert an analog input signal having both positive and negative values to a pulse-density modulated signal through the use of a delta-sigma modulator. The pulse-density modulated signal can then be processed by a variety of digital signal processing circuits.

In some applications, it is desirable for the output pulse-density to be zero when the input signal is zero. For example, in some acceleration sensing applications, only positive acceleration values are of interest. In an automotive application, the positive polarity of acceleration may be defined as that which is directed from the front toward the rear of the vehicle. Therefore, the output pulse density must transition from zero to 100% as the input signal transitions from zero to fullscale. This is contrasted with the case in which the pulse density is 50% at zero input for an analog signal having both positive and negative excursions and then transitions between 0% and 100% as the input signal goes from negative to positive fullscale.

A delta-sigma modulator can be adjusted to a 0% pulse density at zero input signal, as required by applications such as that mentioned above. However, in situations where negative input signal polarities can exist, a negative input signal polarity can drive the circuit into saturation. Under these circumstances, when positive signal polarities return there can be a substantial delay before the circuit comes out of saturation and returns to proper operation. This may be undesirable since the function of the circuit is to respond immediately to positive signal polarities while ignoring negative ones.

A solution to the saturation problem can be achieved by adjusting the delta-sigma modulator circuit to deliver a 50% pulse density at zero input signal, and then incorporating a pulse density mapping circuit which converts the 50-to-100% pulse density range from the delta-sigma modulator circuit into a 0-to-100% pulse density range. All pulse densities less than 50% from the delta-sigma modulator would be mapped to 0%. This required performance of the pulse density mapping circuit is shown generally in FIGS. 1 and 2. This mapping allows the input signal to go negative without saturating the delta-sigma modulator circuit, while at the same time mapping only the positive portion of the input signal range into the full zero-to-100% pulse density range for processing by subsequent digital signal processing circuitry.

A simple prior art circuit for performing the above pulse density mapping can be configured using only a one-clock delay circuit and an AND gate, as shown in FIG. 3. The input of the circuit is coupled both to a one clock delay buffer 10 and to the input of an "AND gate" 20. The other input of the AND gate 20 is coupled to the output of the buffer 10. This circuit operates by outputting a 1 whenever both the current input is a 1 and the input on the previous clock cycle was also a 1. The input/output transfer function for this prior art circuit is illustrated, for several example pulse densities, in FIG. 5.

Clearly, the mapping shown in FIGS. 1 and 2 is being performed. There is a problem with this circuit, however, in that it functions properly only when the input pulse train does not contain both 11 and 00 pairs. As can be seen, none of the input pulse trains in FIG. 5 contain both 11 and 00 pairs, and in general the delta-sigma modulator output pulse train will contain only 00 pairs for pulse densities less than 50%, and only 11 pairs for pulse densities greater than 50%. The problem arises for a narrow range of pulse densities occurring around the 50% level of the analog input signal. Due to the inherently non-ideal behavior of the delta-sigma modulator in this 50% area, output pulse trains contain periodic "bursts" of both 11 and 00 pairs. These bursts are caused by the inability of any practical comparator, implemented as part of the delta-sigma modulator, to resolve infinitesimally small input signals.

An example of such a burst is shown in FIG. 6, where the input has twenty 1's in forty clock cycles. This signal defines a 50% pulse density, and therefore the output should contain no 1's. However, due to the 11 and 00 pairs in the input pulse train, the pulse density is incorrectly mapped to 10%, which is four 1's in forty clock cycles, by the simple pulse density mapping circuit illustrated in FIG. 3.

Although the specific binary pattern generated during a burst of 11 and 00 pairs is indeterminate, the pattern will have several definite characteristics. These characteristics, which can be proven by intuitive arguments, are also verifiable experimentally. First, if a 00 pattern occurs, then the next binary pair will necessarily be 11, and vice versa. Therefore, the 00 and 11 pairs will alternate. Second, for bursts of 00 and 11 pairs which occur at pulse densities slightly less than 50%, the first and last binary pair will be a 00 pair. Third, for bursts which occur at pulse densities slightly greater than 50%, the first and last binary pairs will be 11 pairs. Fourth, for each full burst, only a single extra 0 will be produced for pulse densities slightly less than 50%, or only a single extra 1 for pulse densities slightly greater than 50%. Fifth, bursts of alternating binary pairs can occur only when the pulse density is in close proximity to 50%. It can be concluded from these characteristics that bursts of alternating pairs of 00 and 11 are of no concern if the pulse density of the signal is measured directly by counting pulses for a period of time, since the alternating pairs cancel each other over time. However, if the pulse mapping function shown in the prior art is performed, the alternating binary pairs can cause serious distortion for pulse densities close to 50% as shown in FIG. 6.

The alternating nature of the 11 and 00 pairs within the bursts can be used to advantage in designing a circuit which does not produce the distortion described above for pulse densities close to the critical 50% level. The present invention includes additional circuitry for cancelling these spurious 00 and 11 pairs that occur around the 50% point.

Accordingly, it is an object of the present invention to receive the serial pulse train from a Delta Sigma modulator and map the serial pulse train to provide a series of 0's when the input is less than 50% and to provide a net increase in the number of 1's in the output signal when the input signal is greater than 50%. It is a second object of the present invention to eliminate extraneous 1's in the output signal when alternate 11 and 00 pairs are present at the input signal.

SUMMARY OF THE INVENTION

A pulse mapping method is provided for receiving as an input signal a serial pulse train of 0 and 1 pulses from a Delta Sigma modulator. When no 11 pairs are present at the input, all 0's are generated at the output. When no 00 pairs are present at the input, a 1 is generated at the output only when the input signal and the input signal delayed by one clock period are both 1's. When 11 and 00 pairs are serially alternating at the input, then a single 1 is generated at the output for each 11 pair in the input not paired with a 00 pair. According to this method, the pulse density in the output increases only responsive to an increase in the net number of 11 pairs in the input signal.

BRIEF DESCRIPTION OF THE DRAWINGS

Other objects, features and advantages of the present invention will be apparent from a study of the written description and the drawings in which:

FIG. 1 illustrates a linear pulse density mapping function for an input having both negative and positive excursions and an output which is linearly proportional to the input.

FIG. 2 illustrates a pulse mapping function of the input of FIG. 1 but having the output equal to 0 for all negative excursions in the input.

FIG. 3 illustrates a prior art embodiment of a circuit for generating the pulse mapping function illustrated in FIG. 2.

FIG. 4 illustrates the first preferred embodiment of the present invention that eliminates the erroneous 1 pulses in the output signal of the prior art circuit illustrated in FIG. 3 which occur around the 50% point in the analog input signal.

FIG. 5 is a series of input and output pulse sequences illustrating the mapping performance of the circuit illustrated in FIG. 3.

FIG. 6 is a pulse mapping example illustrating the erroneous 1's in the output generated by the prior art circuit illustrated in FIG. 3 as a consequence of the input signal being/near the 50% pulse density.

FIG. 7 is a pulse density mapping example showing the same input pulse train used in FIG. 6, and the output serial pulse train provided by the first preferred embodiment of the present invention illustrated in FIG. 4.

DESCRIPTION OF THE PREFERRED EMBODIMENT

With reference to FIG. 4, an output of a one cycle delay buffer 110, in addition to being coupled to one input of an AND gate 120, is also coupled to a first input of a NOR gate 130. The second input of the NOR gate 130 is coupled to the input signal 100. An output of the AND gate 120 is coupled to the S (Set) input of a latch circuit 140. The output of the NOR gate 130 is coupled to the R (Reset) input of the latch circuit 140. The Q output of the latch circuit 140 is coupled through a one clock cycle delay buffer 150 to one input of a second AND gate 160. The other input of the second AND gate 160 is coupled to the output of the first AND gate 120.

In contrast to the prior art circuit illustrated in FIG. 3, the input/output mapping of the improved circuit illustrated in FIG. 4 is shown in FIG. 7.

When the circuit illustrated in FIG. 4 receives a 00 sequence at the input 100, the NOR gate 130 resets the latch 140 and the output Q goes low. On the following clock cycle, the output 200 is disabled (that is, held at 0) by the low input to the second AND gate 160. This condition persists until one clock cycle after the latch 140 is set by a 11 sequence.

The circuit operation is similar to the prior art pulse density mapping circuit of FIG. 3, except that whenever an input pulse train contains both 00 and 11 pairs, it requires one 11 sequence to cancel each 00 sequence. For pulse densities well above 50%, the pulse train contains no 00 pairs and therefore the second AND gate 160 is always enabled, allowing the circuit to function in the same manner as the circuit of FIG. 3. For pulse densities well below 50%, the input pulse train contains no 11 pairs and therefore the second AND gate 160 is always disabled, so the output is all 0's, as desired for pulse densities below 50%. For intermediate pulse densities in the narrow range near 50% where 11 and 00 pairs are both present, the circuit ignores all 11 pairs which are balanced by 00 pairs, thereby producing an increased pulse density at the output 200 only when there is an increase in the net number of 1's in the pulse train at the input 100. With reference to FIG. 6, if the pulse train at the input 100 contains both 11 and 00 pairs and this input is applied to the circuit illustrated in FIG. 4, then extra 1's are correctly removed (assume the latch is initially reset) as illustrated in FIG. 7.

System block diagrams have been used to simplify the explanation of the prior art and of the invention because exact implementation circuitry will be dependent on application details such as power levels, clock speeds, level of integration, semiconductor process capabilities, etc. required for any specific application.

While a preferred embodiment of the invention has been described and explained in its best mode of operation, it will be evident that numerous modifications and variations could be included without departing from the spirit and scope of the present invention.

For example, while the terms "0" and "1" have been used as examples of single binary signals, it will be apparent that these signals may have different polarities and different forms without departing from the scope of the claimed invention.

We claim:

1. A pulse mapping method for receiving at an input node a serial pulse train signal of 0 and 1 pulses at a known clock rate from a Delta Sigma modulator, comprising the steps of:
   a. repetitively sampling two adjacent pulses at the input node for defining sampled clock periods,
   b. generating all 0's at an output node responsive to no 11 pairs being present in the input signal during sequentially sampled clock periods.
   c. generating a 1 at the output node responsive to the input signal and the input signal delayed by one clock period both being 1's when no 00 pairs are present in the input signal during sequentially sampled clock periods.
   d. generating a 1 at the output node for each 11 pair not paired with a 00 pair when 11 and 00 pairs are serially alternating in the input signal during sequentially sampled clock periods, whereby the pulse density of 1's in the output signal increases only responsive to an increase in the net number of 11 pairs in the input signal during the sampled clock periods.

2. A pulse mapping method for receiving at an input node a serial pulse train signal of 0 and 1 pulses at a known clock rate from a Delta Sigma modulator, comprising the steps of:
   a. generating a 1 as a first output signal only responsive to both the input signal and the input signal one clock period earlier being 1's,
   b. generating a 1 as a second output signal only responsive to both the input signal and the input signal one clock period earlier being 0's,
   c. setting a latch which generates a 1 at a third output when the first output signal is 1 and resetting the latch for generating a 0 at the third output when the second output is a 1, and
   d. generating a 1 at an output node only responsive to the first output signal and the third output signal one clock period earlier both being 1's, whereby the density of 1's in the pulse mapped output signal increases only responsive to an increase in the net number of 11 pairs in the input signal during sequentially sampled clock periods.

3. A pulse mapping circuit for receiving at an input node a serial pulse train of 0 and 1 pulses at a known clock rate from a Delta Sigma modulator, and providing at an output node a corresponding but different serial pulse train of 0 and 1 pulses, comprising in combination:
   first means coupled to the input node for generating a 1 at a first output only responsive to both the input signal and the input signal one clock period earlier both being 1's,
   second means, having inputs coupled to the input node and to said first output of said first means, for generating a 1 at an output thereof only responsive to the input signal and the input signal one clock period earlier both being 0's,
   latch means, having a set input coupled to said first output of said first means and having a reset input coupled to said output of said second means, for generating at an output thereof a 1 responsive to receiving a 1 at said set input and for resetting said latch means for generating a 0 at said output thereof responsive to receiving a 1 at said reset input,
   third means, having an input coupled to said output of said latch means and having an output, with said third means for generating at said output a signal representative of the signal at said input one clock period earlier, and
   fourth means, having a first input coupled to said first output of said first means and a second input coupled to said output of said third means, for generating at said output of said pulse mapping circuit a 1 only responsive to said first and second inputs both being 1's, whereby the pulse density of 1's at said output node of said pulse mapping circuit increases during sequentially sampled time periods only responsive to an increase in the net number of 11 pairs at the input node.

4. The pulse mapping circuit described in claim 3 wherein said first means comprises:
   a one-cycle delay buffer having an input coupled to the input node of said pulse mapping circuit and an output representative of the input signal one clock period earlier, a first AND gate having one input coupled to said input node of the pulse mapping circuit and another input coupled to said output of said one-cycle delay buffer, with the output of said first AND gate being a 1 only when said one input and said another input are both 1's.

5. A pulse mapping method for receiving at an input node a serial pulse train signal of first and second pulse signals at a known clock rate from a Delta Sigma modulator, comprising the steps of:
   a. repetitively sampling two adjacent pulse signals at the input node for defining sampled clock periods,
   b. generating all first pulse signals at an output node responsive to no second pulse signal pairs being present in the input signal during sequentially sampled clock periods.
   c. generating a second pulse signal at the output node responsive to the input signal and the input signal delayed by one clock period both being second pulse signals when no first pulse signal pairs are present in the input signal during sequentially sampled clock periods.
   d. generating a second pulse signal at the output node for each second pulse signal pair not paired with a first pulse signal pair when second pulse signal and first pulse signal pairs are serially alternating in the input signal during sequentially sampled clock periods.

whereby the pulse density of second pulse signals in the output signal increases only responsive to an increase in the net number of second pulse signal pairs in the input signal during the sampled clock periods.

6. A pulse mapping method for receiving at an input node a serial pulse train signal of first and second type pulses at a known clock rate from a Delta Sigma modulator, comprising the steps of:
   a. generating a second type pulse as a first output signal only responsive to both the input signal and the input signal one clock period earlier being second type pulses,
   b. generating a second type pulse as a second output signal only responsive to both the input signal and the input signal one clock period earlier being first type pulses,
   c. setting a latch which generates a second type pulse signal at a third output when the first output signal is a second type pulse and resetting the latch for generating a first type pulse at the third output when the second output is a second type pulse, and
   d. generating a second type pulse at an output node only responsive to the first output signal and the third output signal one clock period earlier both being second type pulses, whereby the density of second type pulses in the pulse mapped output signal increases only responsive to an increase in the net number of second type pulse pairs in the input signal during sequentially sampled clock periods.

7. A pulse mapping circuit for receiving at an input node a serial pulse train of first and second type pulses at a known clock rate from a Delta Sigma modulator, and providing at an output node a corresponding but different serial pulse train of first and second type pulses, comprising in combination:
   first means coupled to the input node for generating a second type pulse at a first output only responsive to both the input signal and the input signal one clock period earlier both being second type pulses, second means, having inputs coupled to the input node and to said first output of said first means, for generating a second type pulse at an output thereof only responsive to the input signal and the input signal one clock period earlier both being first type pulses, latch means, having a set input coupled to said first output of said first means and having a reset input coupled to said output of said second means, for generating at an output thereof a second type pulse responsive to receiving a second type pulse at said set input and for resetting said latch means for generating a first type pulse at said output thereof responsive to receiving a second type pulse at said reset input, third means, having an input coupled to said output of said latch means and having an output, with said third means for generating at said output a pulse signal representative of the signal at said input one clock period earlier, and fourth means, having a first input coupled to said first output of said first means and a second input coupled to said output of said third means, for generating at said output of said pulse mapping circuit a second type pulse only responsive to said first and second inputs both being second type pulses, whereby the pulse density of second type pulses at said output node of said pulse mapping circuit increases during the sampled time periods only responsive to an increase in the net number of second type pulse pairs at the input node.

8. The pulse mapping circuit described in claim 7 wherein said first means comprises:

a one-cycle delay buffer having an input coupled to the input node of said pulse mapping circuit and an output representative of the input signal one clock period earlier, a first AND gate having one input coupled to said input node of the pulse mapping circuit and another input coupled to said output of said one-cycle delay buffer, with the output of said first AND gate being a second type pulse only when said one input and said another input are both second type pulses.

* * * * *